United States Patent [19]

Roche

[11] Patent Number: 4,921,572
[45] Date of Patent: May 1, 1990

[54] ETCHANT SOLUTIONS CONTAINING HYDROGEN FLUORIDE AND A POLYAMMONIUM FLUORIDE SALT

[75] Inventor: Thomas Roche, Cheshire, Conn.

[73] Assignee: Olin Corporation, Cheshire, Conn.

[21] Appl. No.: 347,129

[22] Filed: May 4, 1989

[51] Int. Cl.$^5$ ............................................. C09K 13/08
[52] U.S. Cl. .................... 156/653; 156/657; 156/662; 252/79.1; 252/79.3; 134/2
[58] Field of Search .................. 252/79.3, 79.1; 134/2; 156/662, 653, 657

[56] References Cited

U.S. PATENT DOCUMENTS

| | | | |
|---|---|---|---|
| 3,650,960 | 3/1972 | Strauss et al. | 252/79.3 |
| 3,676,240 | 7/1972 | Retaijczyk | 252/79.3 |
| 4,761,244 | 8/1988 | Scardera et al. | 252/79.3 |
| 4,761,245 | 8/1988 | Scardera et al. | 252/793 |

OTHER PUBLICATIONS

Sokhan et al., "Vapor-Liquid Equilibrium . . . Titanium-Dioxide-Water", Chemical Abstract, 100(12):92147n, 1983.

J. Judge, "A Study of the Dissolution of $SiO_2$ in Acidic Fluoride Solution", *Journal of the Electrochemical Society;* Nov. 1971, pp. 1772–1775.

*Primary Examiner*—David L. Lacey
*Assistant Examiner*—Thi Dang
*Attorney, Agent, or Firm*—William A. Simons

[57] ABSTRACT

An aqueous etchant solution made from water, hydrogen fluoride and a polyammonium fluoride salt selected from the group consisting of ethylenediammonium difluoride and diethylenetriammonium trifluoride.

10 Claims, No Drawings

ETCHANT SOLUTIONS CONTAINING HYDROGEN FLUORIDE AND A POLYAMMONIUM FLUORIDE SALT

BACKGROUND OF THE INVENTION

1. Field of the Invention

This invention relates to etchant solutions used in the manufacture of integrated circuits. More particularly, this invention relates to buffered HF etchant solutions which are used to etch silicon dioxide layers used in the manufacture of integrated circuits.

2. Description of the Prior Art

Buffered hydrofluoric acid (also known as BHF or buffered oxide etchant or BOE) is an aqueous solution containing HF and ammonium fluoride ($NH_4F$) and is commonly used today to etch silicon dioxide layers during the fabrication of integrated circuit component and like. Commercially available buffered oxide etchant solutions today generally contain from 4:1 to 100:1 by volume ratio $NH_4F$ (40% by weight) solution to an aqueous HF (49% by weight) solution. These mixtures provide a high concentration of bifluoride ($HF_2^-$) ion species which is the active etching species of the BOE. These solutions also provide a high concentration of fluoride ($F^-$) ion which allows the solubilization of silicon ion as $SiF_6^{-2}$ and, thus, allows the etchant bath to be stable for a relatively long period of time.

However, a significant problem in the shipping and storage of these buffered oxide etchants is the fact that the high concentration of both ammonium ($NH_4^+$) and bifluoride ($HF_2^-$) causes ammonium difluoride ($NH_4HF_2$) to crystallize out of these solutions at relatively high temperatures (e.g. 24° C. for 4:1 by volume BOE). When this occurs, these solutions must be heated before use to solubilize the $NH_4HF_2$ or the etchant solution will exhibit undesirable low etch rates. As a result of this phenomenon, these solutions must be shipped in heated trucks and stored in heated areas to prevent the crystallization from occurring.

It is possible to produce a solution which has a lower crystallization point and a similar etch rate to the standard BOE solutions by lowering both the concentration of HF and $NH_4F$ in the solution (See U.S. Pat. No. 3,650,960 which issued to Strauss et al on Mar. 21, 1972). However, by lowering the HF and $NH_4F$ concentrations the effective life of the etchant is shortened since the solubilization of the silicon dioxide involves the consumption of $HF_2^-$ ions from the solution.

Thus, it is an objective of this invention to provide solutions which are similar in HF and $F^-$ concentration to existing BOE solutions, thus having an effective long life, yet without the undesirable relatively high crystallization points associated with such standard solutions.

It is also an objective of this invention to produce buffered hydrofluoric acid solutions which etch at rates comparable to existing BOE solutions without the disadvantages associated therewith.

Still another object of the present invention is to provide buffered etchant solutions containing polyammonium fluoride salts and hydrogen fluoride which may be stored for extended periods of time at room temperature.

A further object of the present invention is to provide an improved process for etching silicon dioxide layers used in manufacture of integrated circuit components and the like where the etching operation may occur at relatively high etching rates and at room temperature.

BRIEF SUMMARY OF THE INVENTION

Accordingly, the above objects are accomplished by the present invention which is directed to an aqueous etchant solution made from water, hydrogen fluoride and a polyammonium fluoride salt selected from the group consisting of ethylenediammonium difluoride and diethylenetriammonium trifluoride.

Moreover, the present invention is directed to a process for etching a patterned silicon-dioxide coated substrate which comprises immersing the substrate in an aqueous etchant solution made from water, hydrogen fluoride and a polyammonium fluoride salt selected from the group consisting of ethylenediammonium difluoride and diethylenetriammonium trifluoride.

DETAILED DESCRIPTION OF THE PREFERRED EMBODIMENTS

The present invention is preferably made up by mixing aqueous solutions of HF and one or both of the above-noted polyammonium fluoride salts. The preferred aqueous HF solution is the widely available 49% by weight HF solution. The preferred aqueous polyammonium fluoride solutions are either a 6 molar aqueous solution of ethylenediammonium difluoride $[(F^-)^+H_3N-CH_2-NH_3^+(F^-)]$ or 4 molar solution of diethylenetriammonium trifluoride $[(F^-)^+H_3N-CH_2CH-NH_2^{30}(F^-)-CH_2CH_2-NH_3^+(F^-)]$. In any event, any concentration may be used for either component as long as the final concentration of that component is suitable as for etchant purposes.

Preferably, the concentration of HF in the final etchant solution is from about 0.5 to about 15 percent by weight of the total etchant solution. The preferred concentration of the polyammonium salt is from about 15 to about 50 percent by weight of the total etchant solution. The balance is water or other etching components or additives. In the total etchant solution, the mole ratio of the fluoride ion (from the polyammonium fluoride salt or other $F^-$ sources) to HF is from about 100:1 to 0.5:1; more preferably from about 50:1 to 0.9:1 and most preferably from about 10:1 to 1:1.

The etchant solutions of the present invention may be prepared in any suitable manner. For example, any aqueous solution of an above-noted polyammonium fluoride salt and the hydrogen fluoride may be added to a suitable container simultaneously or sequentially with or without other ingredients. Alternatively, an excess molar amount of HF solution may be reacted with an aqueous solution of ethylene diamine or diethylene triamine to form a reaction mixture containing unreacted HF solution and the desired polyammonium fluoride salt.

Other additives normally used in buffered oxide etchant solutions may be included in the novel etchant solutions of the present invention. Ammonium fluoride or additional water or both may be added to enhance the etch rate. See Examples 5 and 7 below. Moreover, polar solvents or diluents such a acetic acid, ethylene glycols, glycerol, and lower alkyl alcohols having from 1 to about 4 carbon atoms may be included. Surfactants may be also added as an optional ingredient. See Example 8 below.

These etchant solutions may be used to etch photoresist patterned silicon dioxide coated substrates used in the manufacture of integrated circuits components employing conventional methods and procedures known in the semiconductor industry. These photoresist patterned silicon dioxide-coated substrates may be produced by well known multi-step processes. Generally, a silicon wafer is heated in an oxygen atmosphere at about 900° C. to 1200° C. to form a surface oxide ($SiO_2$) coating. The silicon oxide-coated wafer is then further coated with photoresist layer and lithographically imaged with a radiation source (e.g. UV light, electron beam, x-ray and the like). This imaging step is followed by a developing step which removes the photoresist layer in either the radiation-exposed or radiation-unexposed areas, thus leaving a photoresist patterned silicon oxide-coated substrate.

The following examples illustrate the present invention with no intention of being limited thereby. All parts and percentages ar by weight unless explicitly stated otherwise.

EXAMPLE 1

Synthesis of Ethylenediammonium Difluoride

Ethylenediammonium difluoride solution was prepared by reacting HF with ethylene diamine in a plastic beaker containing water and surrounded by an ice bath. The reaction was exothermic. The generation of heat was controlled by the addition of small aliquots of the two reacting species alternatively to the reaction solution. Thus, a total of 931.25 grams of 49% HF solution (22.8 moles of HF) was mixed with 685.1 grams of ethylene diamine (11.4 moles) and about 120 ml. of water. The solution was then diluted to 1.9 liters volume with water to provide a 6M solution (12M in fluoride ion) of ethylenediammonium difluoride (51.3% ethylenediammonium difluoride).

EXAMPLE 2

Preparation of 1.70:1 Molar Ratio $F^-$:HF Etchant Solution Employing Ethylenediammonium Difluoride 680ml. of the 6M ethylenediammonium difluoride solution of Example 1 (8.16 moles of $F^-$ ion) and 170 ml. of 28.2M HF solution (4.79 moles of HF) were mixed.

COMPARISON 1

Preparation of 1.70:1 Molar Ration $F^-$:HF Etchant Solution Employing Ammonium Fluoride In comparison, a solution prepared from 200 ml of 12M ammonium fluoride solution (2.4 moles of $F^-$ ion) and 50 ml of 28.2M HF (1.14 moles) was mixed.

EXAMPLE 3

Preparation of 1.42:1 Molar Ration $F^-$:HF Etchant Solution Employing Ethylenediammonium Difluoride A solution was prepared from 200 ml of 6M ethylenediammonium difluoride solution of Example 1 (2.4 moles of $F^-$) and 60 ml of 28.2M HF solution (1.69 moles).

EXAMPLE 4

Preparation of a 2.98:1 Molar Ratio $F^-$:HF Etchant Solution Employing Ethylenediammonium Difluoride A solution was prepared from 700 ml of 6M ethylenediammonium difluoride solution of Example 1 (4.2 moles of $F^-$) and 100 ml of 28.2M HF solution (2.82 moles).

COMPARISON 2

Preparation of a 2.98:1 Molar Ratio $F^-$:HF Etchant Solution Employing Ammonium Fluoride In comparison, a solution prepared from 7 volumes of 12M ammonium fluoride and 1 volume of 28.2M HF was mixed.

EXAMPLE 5

Preparation of a 1.70:1 Molar Ratio $F^-$:HF Etchant Solution Employing Both Ammonium Fluoride and Ethylenediammonium Difluoride One volume of the BHF etchant of example 2 was added to 1 volume of the etchant of Comparison Example 1.

EXAMPLE 6

Preparation of a 1.70:1 Molar Ratio $F^-$:HF Etchant Solution Employing Diethylenetriammonium Trifluoride A solution of 4M diethylenetriammonium trifluoride (12 M in $F^-$ ion) was prepared by reaction of diethylenetriamine with hydrofluoric acid (three moles of HF per mole of amine) in the manner as the synthesis described in Example 1. This solution contains an amount of fluoride ion comparable to 6M ethylenediammonium difluoride or 12M ammonium fluoride 160 ml of this solution (1.92 moles of $F^-$ ion) was mixed with 40 ml of 28.2M HF (1.13 moles of HF), a ratio of 4:1 by volume.

Crystallization Point and Etch Rate Determinations

The crystallization points of the above solutions of Examples 2-6 and Comparisons 1 and 2 were determined by freezing these solutions and slowly allowing each solution to warm to room temperature while monitoring the temperature and the presence of crystals in that solution. The determined crystallization temperatures for each solution are shown in Table 1.

The etch rate of each solution at 25° C. on a silicon dioxide layer (about 6000 angstroms) which had been grown on a silicon wafer were also determined. These etch rates were found by measuring the thickness of the silicon dioxide on an ellipsometer, immersing it in an etchant solution for a measured time period and measuring the thickness of remaining oxide. The determined etch rates for each solution are also shown in Table 1.

TABLE 1

ETCH RATES OF BOE SOLUTIONS AND CRYSTALLIZATION POINTS

| Example | $F^-$:HF Mole Ratio | Etch Rate at 25° C. | Crystallization Point (°C.) |
|---|---|---|---|
| 2 | 1.70 | 1240 | 0 |
| C-1 | 1.70 | 1800 | 24 |
| C-1 | 1.70 | 3300 (at 35° C.) | 24 |
| 3 | 1.42 | 1800 | 7 |
| 4 | 2.98 | 520 | 6 |
| 4 | 2.98 | 1000 (at 35° C.) | 6 |
| C-2 | 2.98 | 1000 | 10 |
| 5 | 1.70 | 1650 | - |
| 6 | 1.70 | 1070 | 12 |
| | | | −10 |

EXAMPLE 7

Preparation of 1.42:1 Molar Ratio of $F^-$:HF Etchant Solution Employing Ethylenediammonium Difluoride and Water An etchant solution was prepared by mixing 688 ml of 6molar ethylenediammonium difluoride (8.26 moles of $F^-$ ion) with 205.7 ml of 28.2 HF (5.80 moles) followed by the addition to the mixture of 165 ml of water.

The crystallization point of this Example was determined in the manner as the previous Examples and Comparisons to be 2° C.

The etch rate of this solution at 25° C. on a 6000 angstrom silicon oxide layer grown in a silicon wafer was also determined in the same manner as the previous Examples and Comparisons. That etch rate at 25° C. was 1700 angstroms per minute and the etch rate at 35° C. was 3000 angstroms per minute.

If this etchant solution was compared to the etchant solution of Comparison 1, it would be noted that the activation energy for both solutions would be the same. However, the lower crystallization point of this Example is more preferred over the higher crystallization point of the solution of Comparison 1.

EXAMPLE 8

Etching of Photoresist Patterned Silicon Dioxide-Coated Silicon Wafer

An etchant solution was prepared by adding 0.25 grams (250 ppm) of an alkylphenol polyglycidol ether surfactant ④ to 1000 grams of the etchant solution of Example 7.

④ Surfactant 10G available from Olin Corporation of Stamford, Conn.

This etchant solution was used to immersion etch for 228 seconds a silicon dioxide film (6400 angstroms thick) which had to be grown on a 4 inch silicon wafer, coated with a photoresist that had been imaged and developed to form a variety of lines and spaces having dimensions from 5 microns to 0.8 microns. After the etching operation was completed, the etched silicon dioxide film was examined on a microscope at 400X for etching defects. None were found.

What is claimed is:

1. An aqueous etchant solution comprising water, hydrogen fluoride and a polyammonium fluoride salt selected from the group consisting of ethylenediammonium difluoride and diethylenetriammonium trifluoride.

2. The etchant solution of claim 1 wherein the mole ratio of fluoride ions to HF is from about 100:1 to about 0.5:1.

3. The etchant solution of claim 2 wherein said mole ratio of fluoride ions to HF is from about 50:1 to about 0.9:1.

4. The etchant solution of claim 3 wherein said mole ratio of fluoride ion to HF is from about 10:1 to about 1:1.

5. The etchant solution of claim 1 wherein said hydrogen fluoride is present in a concentration from about 0.5 to about 15 percent by weight.

6. The etchant solution of claim 1 wherein said polyammonium fluoride salt is present in a concentration from about 15 to about 50 percent by weight.

7. The etchant solution of claim 1 additionally comprising a surfactant.

8. The etchant solution of claim 1 additionally comprising ammonium fluoride.

9. An aqueous etchant solution comprising water, hydrogen fluoride and a polyammonium fluoride salt selected from the group consisting of ethylene diammonium difluoride and diethylenetriammonium trifluoride, wherein said hydrogen fluoride is present in a concentration from about 0.5 to about 15 percent by weight of the etchant solution and said polyammonium fluoride salt is present in a concentration from about 15 to about 50 percent by weight of the etchant solution and the mole ratio of fluoride ion to HF is from about 100:1 to about 0.5:1.

10. A process for etching a photoresist patterned silicon dioxide-coated substrate which comprises immersing the substrate in an aqueous etchant solution made from water, hydrogen fluoride and a polyammonium fluoride salt selected from the group consisting of ethylenediammonium difluoride and diethylenetriammonium trifluoride.

* * * * *